United States Patent
Roychowdhury

(12) 
(10) Patent No.: US 6,687,658 B1
(45) Date of Patent: *Feb. 3, 2004

(54) APPARATUS AND METHOD FOR REDUCED-ORDER MODELING OF TIME-VARYING SYSTEMS AND COMPUTER STORAGE MEDIUM CONTAINING THE SAME

(75) Inventor: Jaijeet S. Roychowdhury, Murray Hill, NJ (US)

(73) Assignee: Agere Systems, Inc., Allentown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,799

(22) Filed: Sep. 1, 1998

(51) Int. Cl.[7] .......................... G06F 7/60; G06F 17/10; G06F 17/50; G06F 17/48
(52) U.S. Cl. ................... 703/2; 703/6; 703/13; 703/14
(58) Field of Search ................... 703/2, 6, 13, 14, 703/18

(56) References Cited

U.S. PATENT DOCUMENTS

| | | | | |
|---|---|---|---|---|
| 5,313,398 A | * | 5/1994 | Rohrer et al. | 703/2 |
| 5,537,329 A | * | 7/1996 | Feldmann et al. | 716/4 |
| 5,666,367 A | * | 9/1997 | Troyanovsky | 714/724 |
| 5,689,685 A | * | 11/1997 | Feldmann et al. | 703/2 |
| 5,808,915 A | * | 9/1998 | Troyanovsky | 703/14 |
| 5,867,416 A | * | 2/1999 | Feldmann et al. | 703/801 |
| 5,946,482 A | * | 8/1999 | Barford et al. | 703/2 |
| 5,991,525 A | * | 11/1999 | Shah et al. | 703/2 |
| 5,995,733 A | * | 11/1999 | Roychowdhury | 716/2 |
| 6,041,172 A | * | 3/2000 | Shah et al. | 703/2 |
| 6,072,947 A | * | 6/2000 | Roychowdhury et al. | 703/14 |
| 6,151,698 A | * | 11/2000 | Telichevesky et al. | 703/13 |
| 6,167,359 A | * | 12/2000 | Demir et al. | 702/191 |
| 6,188,974 B1 | * | 2/2001 | Cullum et al. | 703/2 |

FOREIGN PATENT DOCUMENTS

| | | |
|---|---|---|
| EP | 0 690 396 A1 | 1/1996 |
| EP | 0 855 663 A2 | 7/1998 |

OTHER PUBLICATIONS

The Reduction of Perturbed Markov Generators: An Algorithm Exposing the Role of Transient States, Rohlicek et al., ACM 1988.*

"A Unifying Formulation for Analysing Multi–Rate Circuits", IMA Workshop: Algorithmic Methods for Semiconductor Circuitry, Monday Nov. 24, 1997, Abstract.*

Chen, "System and Signal Analysis", Saunders College Publishing, 1989, pp. 21 and 22.*

Ukai et al., "Stabilizing Control of Series Capacitor Compensated Power System on the Basis of Reduced Order Model", APSCOM–91, Nov. 1997.*

Feldmann et al., "Circuit noise evaluation by Pade approximation based model–reduction techniques", IEEE 1997.*

"RICE: Rapid Interconnect Circuit Evaluator", Ratzlaff et al., ACM 1991. Discloses asymptotic waveform evaluation including using Pade approximation.*

(List continued on next page.)

*Primary Examiner*—William Thomson

(57) ABSTRACT

An apparatus for, and method of, modeling a time-varying system and a computer-readable storage medium containing the apparatus or the method. In one embodiment, the apparatus includes: (1) a transfer function generator that develops, for the system, a linear, time-varying transfer function of a particular order and having separate scales corresponding to time variations in the system and an input thereto and (2) an approximator, coupled to the transfer function generator, that approximates the transfer function to yield a model of an order lower than the particular order.

21 Claims, 7 Drawing Sheets

OTHER PUBLICATIONS

"Model Reduction of Time Varying Linear Systems Using Approximate Multi point Kylov subspace Projectors", Phillips, ACM 1998.*

"Efficient Methods for Simulating Highly Nonlinear Multi-Rate Circuits", Roychowdhury, ACM 1997.*

"Efficient Small–Signal Circuit Analysis and Sensitivity Computations with PVL Algorithm", Freund et al., 1994 ACM.*

"Tools and Method for RF IC Design", Dunlop et al. ACM Jun. 15–19, 1998.*

"Simulator Methods for RF Integrated Circuits", Kundert, ACM Nov. 9–13, 1997.*

"Transient Simulation of Lossy Coupled Transmission Lines", Lin et al., ACM 1992.*

"Efficient AC and Noise Analysis of Two Tone RF Circuits", Telichevesky et al., ACM 1996.*

Roychowdhury, et al.: "MPDE methods for efficient analysis of wireless systems" Custom Integrated Circuits Conference, 1998. Proceedings of the IEEE 1998 Santa Clara, CA, USA May 11–14, 1998, New York, NY, USA, IEEE, US, May 11, 1998, pp. 451–454, XP010293952, ISBN: 0–7803–4292–5.

Roychowdhury, J.: "Reduced–order modelling of linear time–varying systems" 1998 IEEE/ACM International Conference on Computer–Aided Design. Digest of Technical Papers (IEEE CAT. No. 98CB36287), Proceedings of ICCAD International Conference on Computer Aided Design, San Jose, CA, USA, Nov. 8–12, 1998, pp. 92–95, XP002184571, 1998, New York, NY, USA, ACM, USA, ISBN: 1–58113–008–2.

* cited by examiner

APPARATUS AND METHOD FOR REDUCED-ORDER MODELING OF TIME-VARYING SYSTEMS AND COMPUTER STORAGE MEDIUM CONTAINING THE SAME

TECHNICAL FIELD OF THE INVENTION

The present invention is directed, in general, to modeling and simulation systems and, more specifically, to an apparatus and method for reduced-order modeling of time-varying systems and a computer-readable storage medium containing the same.

BACKGROUND OF THE INVENTION

An important task in communication system design is hierarchical verification of functionality at different levels, starting from individual circuits up to block representations of full systems. A key step in this process is the creation of small macromodels that abstract, to a given accuracy, the behavior of much bigger subsystems. The macromodels are then clustered into bigger blocks and the procedure may be repeated at a higher level. For systems with "nonlinear" blocks like mixers and switched-capacitor filters, this is typically achieved by using results from detailed nonlinear simulations to construct macromodels manually (based on an understanding of the operation of the blocks in question). This process has disadvantages. Nonlinear simulation does not provide parameters of interest (such as poles and zeros) directly; to obtain them by inspection, frequency-response plots with many points are often computed. This can be very time-consuming for large subsystems, since nonlinear blocks require a steady-state solution at each point. Also, the macromodeling step, critical for reliable verification, is heuristic, time-consuming and highly reliant on detailed internal knowledge of the system under consideration.

Reduced-order modeling is well established for circuit applications. For example, L. T. Pillage and R. A. Rohrer, *Asymptotic Waveform Evaluation for Timing Analysis*, IEEE Trans. CAD, 9:352–366, April 1990; X. Huang, V. Raghavan, and R. A. Rohrer, *AWEsim: A Program for the Efficient Analysis of Linear(ized) Circuits*, Proc. ICCAD, pages 534–537, November 1990; and E. Chiprout and M. S. Nakhla. *Asymptotic Waveform Evaluation Kluwer, Norwell, Mass.*, 1994, address one technique (AWE). P. Feldman and R. Freund, *Efficient Linear Circuit Analysis by Padé Approximation via the Lanczos Process*, IEEE Tans. Cad, 14(5):639–649, May 1995; and P. Feldmann and R. Freund, *Reduced-Order Modeling of Large Linear Subcircuits via a Block Lanczos Algorithm*, Proc. IEEE DAC, pages 474–479, 1995, address another technique (PVL). Finally, A. Odabasioglu, M. Celik, and L. T. Pileggi, *PRIMA: Passive Reduced-Order Interconnect Macromodeling Algorithm*, Proc. ICCAD, pages 58–65, 1997, address still a third technique (PRIMA). (These articles are incorporated herein by reference.) However, these existing methods are applicable only to linear time-invariant (LTI) systems. They are inadequate for communication blocks with properties such as frequency translation, that cannot be represented by LTI models.

Linear time-varying (LTV) descriptions of a system, on the other hand, can capture frequency translation and mixing/switching behavior. LTV transfer functions are often computed in the context of radio frequency (RF) simulation (e.g., plotting frequency-responses or calculating cyclostationary noise). See, for example, R. Telichevesky, K. Kundert, and J. White, *Efficient AC and Noise Analysis of Two-Tone RF Circuits*, Proc. IEEE DAC, pages 292–297, 1996, incorporated herein by reference. However, a formulation suitable for reducing the order of time-varying transfer functions is not, at this point in time, available. Accordingly, what is needed in the art is a way of generating a time-varying transfer function that is amenable to order reduction.

BRIEF SUMMARY OF THE INVENTION

To address the above-discussed deficiencies of the prior art, the present invention provides an apparatus for, and method of, modeling a time-varying system and a computer-readable storage medium containing the apparatus or the method. In one embodiment, the apparatus includes: (1) a transfer function generator that develops, for the system, a linear, time-varying transfer function of a particular order and having separate scales corresponding to time variations in the system and an input thereto and (2) an approximator, coupled to the transfer function generator, that approximates the transfer function to yield a model of an order lower than the particular order.

The basic difficulty heretofore in generalizing LTI model-reduction techniques to the LTV case has been the interference of system time variations with input time variations. The present invention recognizes that time scales should be kept separate, using recently-developed concepts of multiple time variables and multirate partial differential equations (MPDE), resulting in forms for the LTV transfer function that are suitable for model reduction.

The present invention therefore introduces the broad concept of developing a transfer function for a time-varying system in which the system-based and input-based time variations present in the system are kept separate. This allows an approximation to be applied to the transfer function while preserving the independence of the time variations. Thus, approximations which were heretofore useful only in conjunction with time-invariant systems, can now be employed to model time-variant systems, including those that contain nonlinearities.

In one embodiment of the present invention, the approximator is a Padé approximator, the model containing a Padé approximation of the transfer function. Those skilled in the pertinent art are familiar with Padé approximations and their use in approximating time-invariant functions. The present invention employs such approximations to advantage in modeling time-varying systems. However, the present invention is not limited to Padé-type approximations.

In one embodiment of the present invention, the order of the model is selectable. To Thus, a user can select the extent to which the approximation simplifies the transfer function. Of course, while approximations of greater order may be more accurate to the actual transfer function, they are generally more complex and consume more computational time to calculate.

In one embodiment of the present invention, the approximator explicitly calculates moments of the transfer function and matches the moments to yield the model. In an alternative embodiment, the approximator replaces the transfer function directly with the model. Moments of the transfer function are therefore matched implicitly. In a more particular case of the latter embodiment, the approximator replaces the transfer function by employing a Krylov-subspace process. Several different ways of approximating the transfer function will be set forth and explained in detail in the Detailed Description that follows.

The foregoing has outlined, rather broadly, preferred and alternative features of the present invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and one or more specific embodiments as a basis for designing or modifying other structures for carrying out the same purposes of the present invention. Those skilled in the pertinent art should also realize that such equivalent constructions do not depart from the spirit and scope of the invention in its broadest form or the claims.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
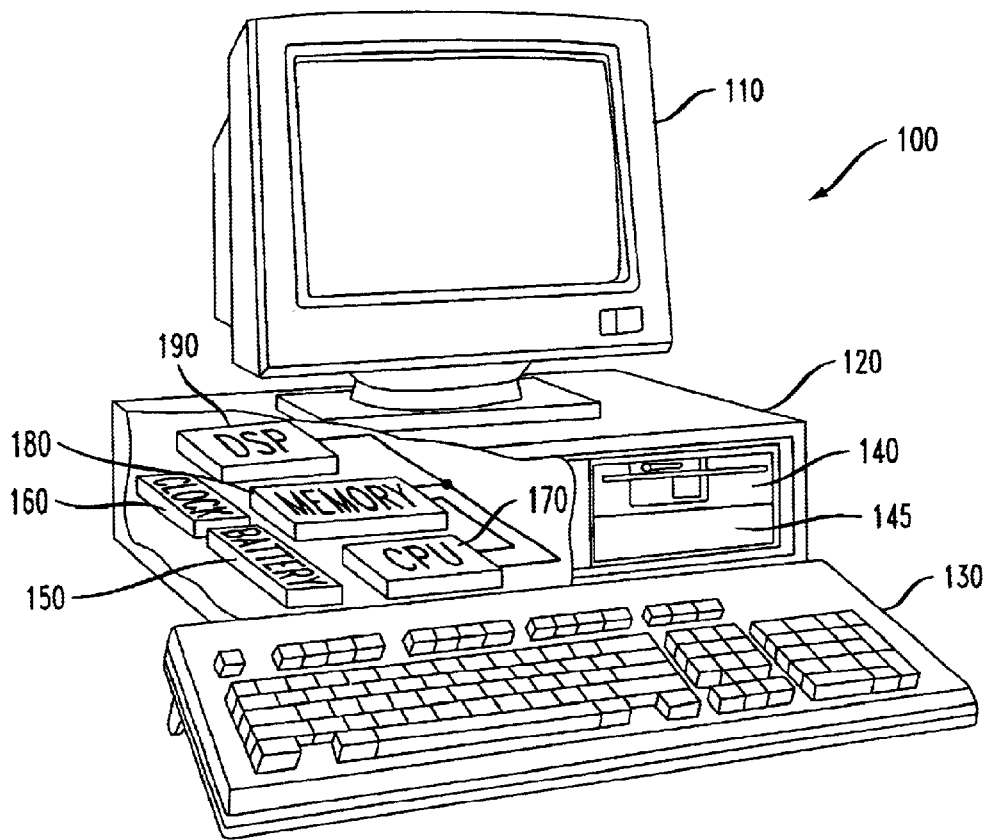
FIG. 1 illustrates a block diagram of a computer system that can form an environment within which a software-based embodiment of the present invention can operate.

Referring initially to FIG. 1, illustrated is a block diagram of a prior art computer system 100 that manifests a new invention when operating a software-based embodiment of the present invention. The computer system 100 is presented as a general purpose computer capable of storing and executing a sequence of instructions to simulate a time-varying system. Since the present invention is not limited to an application in a general purpose computer, however, FIG. 1 is presented only for illustrative purposes.

The computer system 100 includes a monitor or display 110, a chassis 120 and a keyboard 130. The monitor 110 and the keyboard 130 cooperate to allow communication (e.g., via a graphical user interface, or GUI) between the computer system 100 and a user. Alternatively, the monitor 110 and keyboard 130 may be replaced by other conventional output input devices, respectively. The chassis 120 includes both a floppy disk drive 140 and hard disk drive 145. The floppy disk drive 140 is employed to receive, read and write to removable disks; the hard disk drive 145 is employed for fast access storage and retrieval, typically to a nonremovable disk. The floppy disk drive 140 may be replaced by or combined with other conventional structures to receive and transmit data and instructions, including without limitation, tape and compact disc drives, telephony systems and devices (including videophone, paging and facsimile technologies), and serial and parallel ports.

The chassis 120 is illustrated having a cut-away portion that includes a battery 150, clock 160, processor 170 (e.g., a Pentium® Processor as manufactured by Intel Corporation of Santa Clara, Calif.) and memory 180. Although the computer system 100 is illustrated having a single processor 170, hard disk drive 145 and memory 180, the computer system 100 may be equipped with a plurality of processors and peripheral devices.

It should be noted that any conventional computer system having at least one processor that is suitable to function as a general purpose computer may replace, or be used in conjunction with, the computer system 100, including, without limitation: hand-held, laptop/notebook, mini, mainframe and supercomputers, including RISC and parallel processing architectures, as well as within computer system/network combinations. Alternative computer system embodiments may be firmware- or hardware-based.

In alternate advantageous embodiments, the processor 170 may, in whole or in part, be replaced by or combined with any suitable processing configuration, including multi and parallel processing configurations, programmable logic devices, such as programmable array logic (PALs) and programmable logic arrays (PLAs), digital signal processors (DSPs), field programmable gate arrays (FPGAs), application specific integrated circuits (ASICs), large scale integrated circuits (LSIs), very large scale integrated circuits (VLSIs) or the like, to form the various types of circuitry, controllers and systems described and claimed herein.

It should be noted also that while the processor 170 includes the bus configuration as illustrated, alternate configurations are well within the broad scope of the present invention. Furthermore, conventional computer system architecture is more fully discussed in *The Indispensable PC Hardware Book*, by Hans-Peter Messmer, Addison Wesley (2nd ed. 1995) and *Computer Organization and Architecture*, by William Stallings, MacMillan Publishing Co. (3rd ed. 1993); conventional computer, or communications, network design is more fully discussed in *Data Network Design*, by Darren L. Spohn, McGraw-Hill, Inc. (1993) and conventional data communications is more fully discussed in *Voice and Data Communications Handbook*, by Bud Bates and Donald Gregory, McGraw-Hill, Inc. (1996), *Data Communications Principles*, by R. D. Gitlin, J. F. Hayes and S. B. Weinstein, Plenum Press (1992) and *The Irwin Handbook of Telecommunications*, by James Harry Green, Irwin Professional Publishing (2nd ed. 1992). Each of the foregoing publications is incorporated herein by reference.

The present invention may be embodied in a sequence of software instructions executable in data processing and storage circuitry (for example, the computer system 100). The sequence of software instructions may be contained on a computer-readable storage medium, such as a magnetic or optical disk, or some other current or later-developed medium. Those skilled in the pertinent art will recognize the advantages that result when the present invention, so embodied, is allowed to cooperate with simulation software likewise executing in the data processing and storage circuitry. However, those skilled in the pertinent art will also understand that the principles of the present invention are as legitimately carried out in analog or digital hardware.

Figure 2:
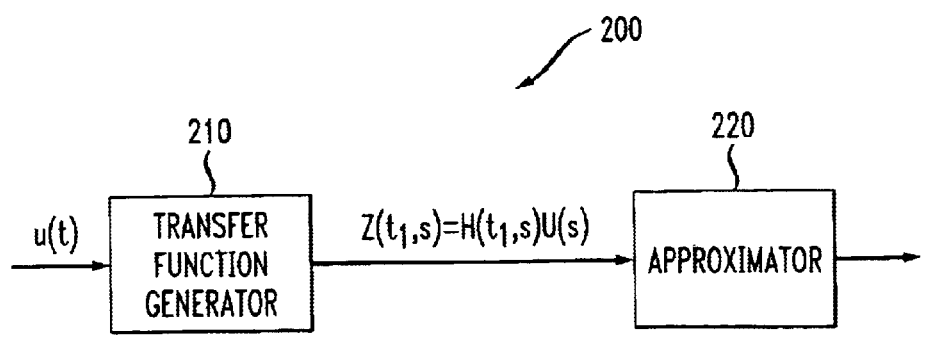
FIG. 2 illustrates a block diagram of an embodiment of an apparatus for modeling a time-varying system constructed according to the present invention.

Turning now to FIG. 2 illustrated is a block diagram of an exemplary embodiment of an apparatus, generally designated 200, for modeling a time-varying system constructed according to the present invention. The apparatus 200 includes a transfer function generator 210 that develops, for the system, a linear, time-varying transfer function of a particular order and having separate scales corresponding to time variations in the system and an input thereto. The time-varying transfer function may be an LTV transfer function.

As described above, LTV transfer functions are often computed in the context of RF simulation (e.g., plotting frequency-responses or calculating cyclostationary noise), but a formulation suitable for model reduction has not to this point in time been available. One embodiment of the present invention, henceforth termed time-varying Padé (TVP), has several useful features. The computation/memory requirements of the method scale almost linearly with circuit size, because factored-matrix computations and iterative linear algebra are used. See, for example, M. Rosch and K. L. Antreich, *Schnell Stationare Simulation Nichtlinearer Schaltungen im Frequenzbereich*, AEU, 46(3):168–176, 1992; R. C. Melville, P. Feldman, and J. Roychowdhury, *Efficient Multi-Tone Distortion Analysis of Analog Integrated Circuits*, Proc. IEEE CICC, pages 241–244, May 1995; P. Feldmann, R. C. Melville, and D. Long, *Efficient Frequency Domain Analysis of Large Nonlinear Analog Circuits*, Proc. IEEE CICC, May 1996; and J. Roychowdhury, D. Long and P. Feldmann, *Cyclostationary Noise Analysis of Large RF Circuits with Multitone Excitations*, IEEE J. Solid-State Ckts., 33(2):324–336, March 1998. All of these articles are incorporated herein by reference.

TVP provides the reduced-order model as a LTI system followed by a memoryless mixing operation; this makes it easy to incorporate the macromodel in existing circuit and system level simulators. TVP itself can be implemented easily in a number of existing simulation tools, including nonlinear time-domain simulators, such as the commercially-available SPICE, nonlinear frequency-domain domain simulators using harmonic balance, as well as linear time-varying simulators, such as the commercially-available SWITCAP and SIMPLIS. Time-domain computations, moreover, do not necessarily require obtaining or using a steady state of the system. Existing LTI model reduction codes can be used as black boxes in TVP's implementation. Like its LTI counterparts, TVP based on Krylov methods is numerically well-conditioned and can directly produce dominant poles and residues.

Most importantly, by providing an algorithmic means of generating reduced-order models to any desired accuracy, TVP enables macromodels of communication subsystems to be coupled to detailed realizations much more tightly and quickly than previously possible. This can significantly reduce the number of iterations it takes to settle on a final design. TVP can be used on anything with a linear aspect to its operation, including RF blocks, switched-capacitor filters, switching power, converters and even some digital elements, while extensions can handle nonlinearities and oscillatory behavior. The Floquet parameters the method generates can be useful for phase noise calculation.

The LTV Transfer Function

A nonlinear system can be considered as being driven by a large signal $b_l(t)$ and a small input signal $u(t)$, to produce an output $z_t(t)$ (for simplicity, both $u(t)$ and $z(t)$ may be taken to be scalars; the generalization to the vector case is straightforward). The nonlinear system is modeled using vector differential-algebraic equations (DAEs), a description adequate for circuits and many other applications:

$$\frac{\partial q(y(t))}{\partial t} + f(y(t)) = b_l(t) + bu(t) \quad (1)$$

$$z_t(t) = d^T y(t)$$

In the circuit context, y(t) is a vector of node voltages and branch currents; q( ) and f( ) are nonlinear functions describing the charge/flux and resistive terms, respectively, in the circuit. b and d are vectors that link the input and output to the rest of the system.

It is convenient, at this point, to move the MPDE form of Equation (1). Doing so enables the input and system time-scales to be separated and, as will become apparent, leads to a form of the LTV transfer function useful for reduced-order modeling. The move to the MPDE Equation (2), below, is justified by the fact that Equation (1) is exactly equivalent to Equation (2).

$$\frac{\partial q(\hat{y})}{\partial t_1} + \frac{\partial q(\hat{y})}{\partial t_2} + f(\hat{y}(t_1, t_2)) = b_l(t_1) + bu(t_2) \quad (2)$$

$$\hat{z}_t(t_1, t_2) = d^T \hat{y}(t_1, t_2)$$

$$z_t(t) = \hat{z}_t(t, t)$$

The hatted variables in Equation (2) are bivariate (ie., two-time) forms of the corresponding variables in Equation (1).

To obtain the output component linear in u, a linearizaton may be performed around the solution of Equation (2) when $u(t_2)=0$. Let this solution be $\hat{y}^*(t_1)$ (note that $\hat{y}^*$ can always be selected to be independent of $t_2$). Linearization about $\hat{y}^*$ yields the linear MPDE:

$$\frac{\partial(C(t_1)\hat{x}(t_1, t_2))}{\partial t_1} + \frac{\partial(C(t_1)\hat{x}(t_1, t_2)))}{\partial t_2} + G(t_1)\hat{x}(t_1, t_2) = bu(t_2) \quad (3)$$

$$\hat{z}(t_1, t_2) = d^T \hat{x}(t_1, t_2)$$

$$z(t) = \hat{z}(t, t)$$

In Equation (3), the quantities, $\hat{x}$, $\hat{z}$ and z are the small-signal versions of $\hat{y}$, $\hat{z}_t$, and $z_t$, respectively;

$$C(t_1) = \frac{\partial q(\hat{y})}{\partial \hat{y}}\bigg|_{\hat{y}(t_1)} \text{ and } G(t_1) = \frac{\partial f(\hat{y})}{\partial \hat{y}}\bigg|_{\hat{y}(t_1)}$$

are time-varying matrices.

Note that the bi-variate output $\hat{z}(t_1, t_2)$ is linear in the input $u(t)_3$ but that the relationship is time-varying because of the presence of $t_1$. To obtain the time-varying transfer function from u to $\hat{z}$, Equation (3) can be Laplace-transformed with respect to $t_2$:

$$\frac{\partial(C(t_1)\hat{X}(t_1, s))}{\partial t_1} + sC(t_1)\hat{X}(t_1, s) + G(t_1)\hat{X}(t_1, s) = bU(s) \quad (4)$$

$$\hat{Z}(t_1, s) = d^T \hat{X}(t_1, s)$$

In Equation (4), s denotes the Laplace variable along the $t_2$ time axis; the capital symbols denote transformed variables.

By defining the operator $$\frac{D}{dt_1}[v] = \frac{\partial(C(t_1)v)}{\partial t_1} \quad (5)$$

Equation (4) can be rewritten as $$\left(\frac{D}{dt_1}[] + sC(t_1) + G(t_1)\right)\hat{X}(t_1, s) = bU(s) \quad (6)$$

$$\hat{Z}(t_1, s) = d^T \hat{X}(t_1, s)$$

to obtain an operator form of the time-varying transfer function H $(t_1, s)$:

$$H(t_1, s) = d^T\left(\frac{D}{dt_1}[] + sC(t_1) + G(t_1)\right)^{-1}[b] \quad (7)$$

$$\hat{Z}(t_1, s) = H(t_1, s)U(s)$$

Finally, the frequency-domain relation between the output z(t) and its bi-variate form $\hat{z}$ is:

$$Z(s) = \int_{-\infty}^{\infty} \hat{Z}_s(s - s_2, s_2)\, ds_2 \quad (8)$$

where Z(s) is the Laplace transform of z(t) and $Z_s(s_1, s_2)$ the two-dimensional Laplace transform of $\hat{z}(t_1, t_3)$, or equivalently, the Laplace transform of $Z(t_1, s_2)$ with respect to $t_1$.

The operator form of Equation (7) is already useful for reduced-order modeling; However, the $t_1$ dependence can be expanded in a basis. This leads to matrix forms of the transfer function, to which existing model reduction codes can be applied—an advantageous feature for implementation. Frequency-domain basis functions, considered below, are natural for applications with relatively sinusoidal variations, while time-domain ones are better suited to systems with switching behavior or those that are not periodic.

Frequency-Domain Matrix Form

Assume $C(t_1)$ and $G(t_1)$ to be periodic with angular frequency $\omega_0$. $W(t_1, s)$ can be defined to be the operator-inverse in Equation (7):

$$W(t_1, s) = \left(\frac{D}{dt_1}[] + sC(t_1) + G(t_1)\right)^{-1}[b] \Rightarrow \quad (9)$$

$$\frac{D}{dt_1}[W(t_1, s)] + [sC(t_1) + G(t_1)]W(t_1, s) = b$$

Assume $W(t_1, s)$ also to be in periodic steady-state in $t_1$, and expand $C(t_1)$, $G(t_1)$, and $W(T_1, s)$ in Fourier series with coefficients, $C_i$, $G_i$, and $W_i(s)$, respectively:

$$C(t_1) = \sum_{i=-\infty}^{\infty} C_i e^{ji\omega_0 t_1} \quad (10)$$

$$G(t_1) = \sum_{i=-\infty}^{\infty} G_i e^{ji\omega_0 t_1}$$

$$W(t_1, s) = \sum_{i=-\infty}^{\infty} W_i(s) e^{ji\omega_0 t_1}$$

Now the following long vectors of Fourier coefficients can be defined:

$$\vec{W}_{FD}(s) = [\ldots, W_{-2}^T(s), W_{-1}^T(s), W_0^T(s), W_1^T(s), W_2^T(s), \ldots]^T$$

$$\vec{B}_{FD} = [\ldots, 0, 0, b^T, 0, 0, \ldots]^T \quad (11)$$

By putting the Equations (10) in Equation (9) and equating coefficients of $e^{i\omega_0 t_1}$, it can be verified that the following block-matrix equation holds:

$$[sC_{FD} + \underbrace{(\mathcal{G}_{FD} + \Omega C_{FD})}_{\text{denote this by } \mathcal{J}_{FD}}]\vec{W}_{FD}(s) = \vec{B}_{FD} \quad (12)$$

where $$C_{FD} = \begin{bmatrix} \vdots & \vdots & \vdots \\ \ldots & C_0 & C_{-1} & C_{-2} & \ldots \\ \ldots & C_1 & C_0 & C_{-1} & \ldots \\ \ldots & C_2 & C_1 & C_0 & \ldots \\ \vdots & \vdots & \vdots \end{bmatrix}, \quad (13)$$

$$\mathcal{G}_{FD} = \begin{bmatrix} \vdots & \vdots & \vdots \\ \ldots & G_0 & G_{-1} & G_{-2} & \ldots \\ \ldots & G_1 & G_0 & G_{-1} & \ldots \\ \ldots & G_2 & G_1 & G_0 & \ldots \\ \vdots & \vdots & \vdots \end{bmatrix}$$

$$\mathcal{J}_{FD} = \mathcal{G}_{FD} + \Omega C_{FD}, \Omega = j\omega_0 \begin{bmatrix} \ddots & & & & \\ & -2I & & & \\ & & -I & & \\ & & & 0I & \\ & & & & I \\ & & & & & 2I \\ & & & & & & \ddots \end{bmatrix}$$

Now denote $$E(t_1) = [\ldots, Ie^{-j2\omega_0 t_1}, Ie^{-j\omega_0 t_1}, I, Ie^{j\omega_0 t_1}, Ie^{j2\omega_0 t_1}, \ldots]^T \quad (14)$$

From Equations (12), (9) and (7), the following matrix expression for H $(t_1, s)$ can be obtained:

$$H(t_1, s) = d^T E^T(t_1)[sC_{FD} + \mathcal{J}_{FD}]^{-1}\vec{B}_{FD} \quad (15)$$

From Equation (14), $E(t_1)$ can be written in the Fourier expansion:

$$E(t_1) = \sum_{i=-\infty}^{\infty} E_i e^{ji\omega_0 t_1}, \quad (16)$$

$$E_i = [\ldots, 0, 0, \underbrace{I}_{i^{th}\,position}, 0, \ldots, 0, \ldots]^T$$

Hence, Equation (15) can be rewritten in a Fourier series:

$$H(t_1, s) = \sum_{i=-\infty}^{\infty} H_i(s) e^{ji\omega_0 t_1}, \quad (17)$$

$$H_i(s) = d^T E_i^T [sC_{FD} + \mathcal{J}_{FD}]^{-1}\vec{B}_{FD}$$

Figure 3:
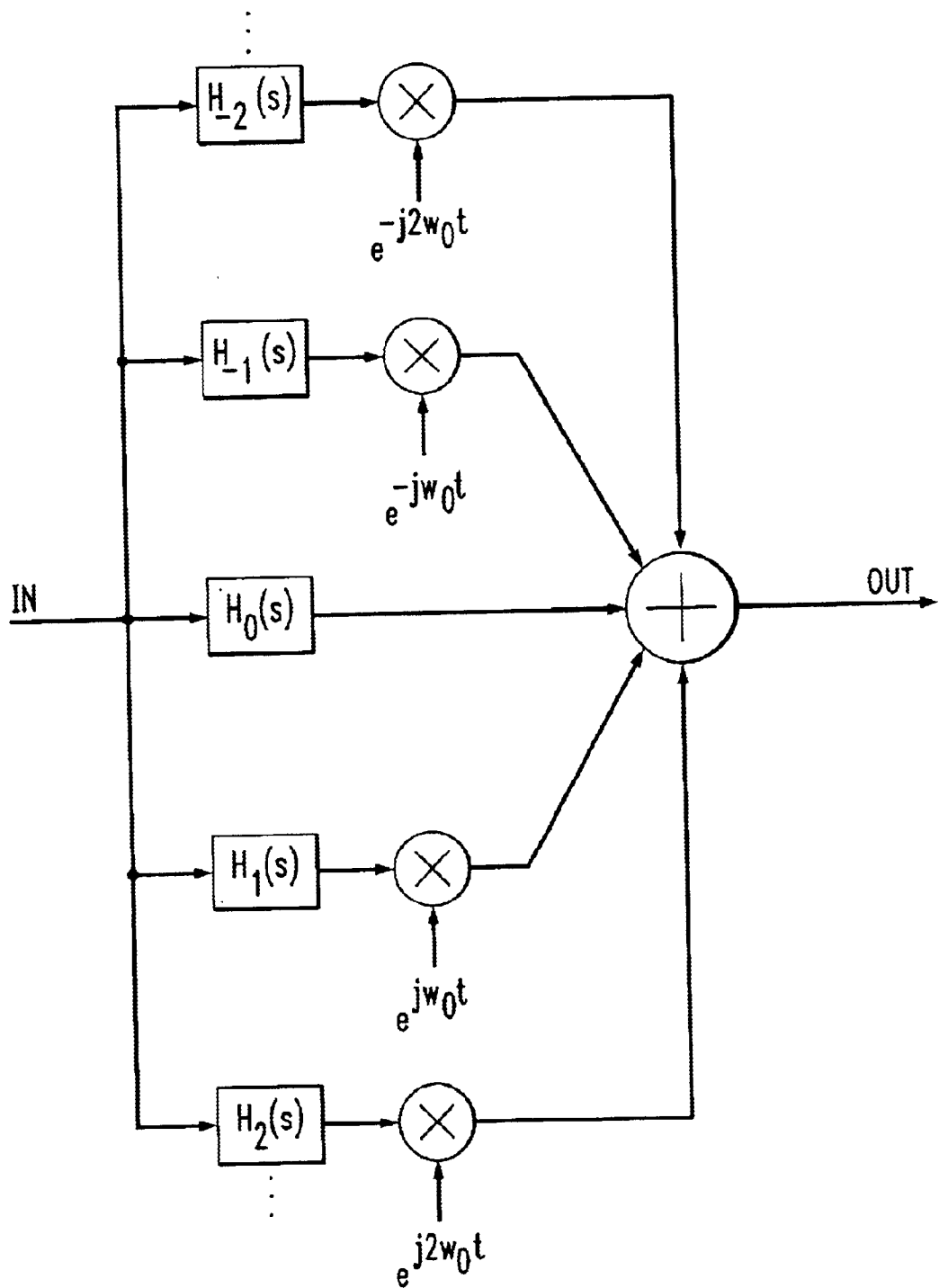
FIG. 3 illustrates a block diagram of a Floquet representation of an LTV system.

Equation (17) implies that any linear periodic time-varying system can be decomposed into LTI systems followed by memoryless multiplications with $e^{ji\omega_0 t}$, as FIG. 3 illustrates. Hence, the above constitutes an alternative derivation of Floquet theory. The quantities $H_i(s)$ are hereinafter termed "baseband-referred transfer functions."

Define:

$$\vec{H}_{FD}(s) = [\ldots, H_{-2}(s), H_{-1}(s), H_0(s), H_1(s), H_2(s), \ldots]^T \quad (18)$$

Then, $$\vec{H}_{FD}(s) = \mathcal{D}^T[sC_{FD} + \mathcal{J}_{FD}]^{-1}\vec{B}_{FD}, \quad (19)$$

$$\mathcal{D} = \begin{bmatrix} \ddots & & & \\ & d & & \\ & & d & \\ & & & d \\ & & & & \ddots \end{bmatrix}$$

Equation (19) is a block matrix equation for a single-input multiple-output transfer function. If the size of the LTV system Equation (3) is n, and N harmonics of the LTV system are considered in practice, then $\vec{B}_{FD}$ is a vector of size Nn×1, $C_{FD}$ and $J_{FD}$ are square matrices of size Nn×Nn, D is a rectangular matrix of size Nn×N, and $\vec{H}_{FD}(s)$ is a vector of size N.

Time-domain Matrix Form

Consider Equation (9) again:

$$\frac{D}{dt_1}[W(t_1,s)] + [sC(t_1) + G(t_1)]W(t_1,s) = b \quad (20)$$

$$H(t_1,s) = d^T W(t_1,s)$$

Equation (20) can be collocated over t1 ∈ [0, $T_1$] at N+1 samples $t_{1,0}=0$, $t_{1,1}$, ..., $t_{1,N}$, using a linear multistep formula (for example, Backward Euler) to express the differential in terms of samples. Denote by the long vectors $\vec{W}_{FD}$ and $\vec{B}_{FD}$ the samples of W ($t_1$, s) and b:

$$\vec{W}_{TD}(s) = [W^T(t_{1,0},s), W^T(t_{1,1},s), \ldots, W^T(t_{1,N},s)]^T$$

$$\vec{B}_{TD} = [b^T, b^T, b^T, \ldots, b^T]^T \quad (21)$$

The following matrix form for the collated equations can then be obtained:

$$[sC_{TD} + \mathcal{J}_{TD}]\vec{W}_{TD}(s) = \vec{B}_{TD} \quad (22)$$

where $$\mathcal{J}_{TD} = \mathcal{G}_{TD} + \Delta C_{TD}, \quad \mathcal{G}_{TD} = \begin{bmatrix} G(0) & & & \\ & G(t_{1,1}) & & \\ & & \ddots & \\ & & & G(t_{1,N}) \end{bmatrix}, \quad (23)$$

$$\Delta = \begin{bmatrix} \frac{1}{\delta_1}I & & & \\ -\frac{1}{\delta_2}I & \frac{1}{\delta_2}I & & \\ & \ddots & \ddots & \\ & & -\frac{1}{\delta_N}I & \frac{1}{\delta_N}I \end{bmatrix}, \quad \delta_i = t_{1,i} - t_{1,i-1}$$

$$C_{TD} = \begin{bmatrix} C(0) & & & \\ & C(t_{1,1}) & & \\ & & \ddots & \\ & & & C(t_{1,N}) \end{bmatrix}$$

and zero initial conditions W(0, s)=0 are assumed. If the system is periodic, then periodic boundary conditions can be applied; the only change in Equation (22) and Equation (23) is to Δ, the differentiation matrix, which becomes:

$$\Delta = \begin{bmatrix} \frac{1}{\delta_1}I & & & -\frac{1}{\delta_1}I \\ -\frac{1}{\delta_2}I & \frac{1}{\delta_2}I & & \\ & \ddots & \ddots & \\ & & -\frac{1}{\delta_N}I & \frac{1}{\delta_N}I \end{bmatrix} \quad (24)$$

Define:

$$\vec{H}_{TD}(s) = [H(t_{1,0},s), H(t_{1,1},s), \ldots, H(t_{1,N},s)]^T \quad (25)$$

Then, $$\vec{H}_{TD}(s) = D^T[sC_{TD} + \mathcal{J}_{TD}]^{-1}\vec{B}_{TD} \quad (26)$$

with D as in Equation (19). The forms for the LTV transfer function contained in Equations (7), (19) and (26) can be expensive to evaluate, since the dimension of the full system can be large in practice. Methods are now presented for approximating H ($t_1$, s) using quantities of much smaller dimension.

Padé Approximation of the LTV Transfer Function

The apparatus 200 illustrated in FIG. 2 further includes an approximator 220, coupled to the transfer function generator 210. The approximator 220 approximates the transfer function to yield a model of an order lower than the particular order. In the illustrated embodiment, the approximator 220 is a Padé approximator.

The underlying principle is that of Padé approximation, i.e., for any of the forms of the LTV transfer function, to obtain a smaller form of size q whose first several moments match those of the original large system. This can be achieved in two broad ways, with correspondences in existing LTI model-reduction methods. TVP-E (TVP-Explicit), roughly analogous to AWE for LTI systems, involves calculating moments of the large system explicitly and building the reduced order model from these moments. The method if outlined below. Another procedure, TVP-K (TVP-Krylov) replaces the large system directly with a smaller one, achieving moment-matching implicitly. This uses Krylov-subspace methods and is analogous to LTI model-reduction techniques based on the Lanczos process (such as PVL and MPVL), operator-Krylov methods (See, M. Celik and A. C. Cangellaris, *Simulation of Dispersive Multiconductor Transmission Lines by Padé Approximation by the Lonczos Process*, IEEE Trans. MTT, (44):2525–2535, 1996; and M. Celik and A. C. Cangellaris, *Simulation of Multiconductor Transmission Lines Using Krylov Subspace Order-Reduction Techniques*, IEEE trans. CAD, (16):485–496, 1997, both of which being incorporated herein by reference), Arnoldi-based processes, such as PRIMA, and others (See, I. M. Jaimoukha, *A General Minimal Residual Krylov Sub-* space *Method for Large-Scale Model Reduction*, IEEE Trans. Automat. Control, (42): 1422–1427, 1997; and I. Elfadel and D. Ling, *A Block Rational Arnoldi Algorithm for Multipoint Passive Model-Order Reduction of Multiport RLC Networks*, Proc. ICCAD, pages 66–71, 1997, both of which being incorporated herein by reference). As in the LTI methods, TVP based on Krylov subspaces has several advantages over explicit moment matching, and is presented below. Operator- or matrix-based techniques can be applied to both explicit and Krylov-based TVP; both an operator-based procedure and a matrix-based procedure will be explained below.

TVP-E: TVP Using Explicit Moment Matching

Any of the forms Equation (7), Equation (19) and Equation (26) can be used for explicit moment matching. Here, an operator procedure using Equation (7) is illustrated. $H(t_1, s)$ can be rewitten from Equation (7) as:

$$H(t_1, s) = d^T (I[] + sL[])^{-1} [r(t_1)] \qquad (27)$$

where $I$ denotes the identity operator, $$L[v] = \left(\frac{D}{dt_1}[] + G(t_1)\right)^{-1} [C(t_1)v], \text{ and}$$

$$r(t_1) = \left(\frac{D}{dt_1}[] + G(t_1)\right)^{-1} [b]$$

$H(t_1, s)$ in Equation (27) can be expanded as:

$$H(t_1, s) = d^T(r(t_1) - sL[r(t_1)] + s^2 L[L[r(t_1)]] + \ldots) \qquad (28)$$

$$= \sum_{i=0}^{\infty} m_i(t_1) s^i,$$

where $m_i(t_1) = (-1)^i d^T \underbrace{L[L[\ldots L[r(t_1)]\ldots]]}_{i \text{ applications of } L[]}$ $m_i(t_1)$ in Equation (28) are the time-varying moments of $H(t_1, s)$. Note that these moments can be calculated explicitly from their definition in Equation (28) by repeated applications of L■. From its definition in Equation (27), applying L■ corresponds to solving a linear time-varying differential equation. If the time-varying system is in periodic steady-state, as is often the case in applications, L■ can be applied numerically by solving the equations that arise in the inner loop of harmonic balance of shooting methods. Recently-developed iterative methods enable large systems of these equations to be solved in linear time. Hence, the time-varying moments can be calculated easily.

Once the moments $m_i(t_1)$ have been computed, $T_1$ can be fixed at a given value, and any existing LTI model reduction technique using explicit moments (e.g., AWE) can be run in q steps to produce a $q^{th}$-order-reduced model. This step can be repeated for all $t_1$ values of interest, to produce an overall reduced-order model for $H(t_1, s)$ in the form:

$$\tilde{H}^q(t_1, s) = \frac{\sum_{i=0}^{q-1} a_i(t_1) s^i}{\sum_{j=0}^{q} b_j(t_1) s^j} = \sum_{i=0}^{q} \frac{c_i(t_1)}{s + p_i(t_1)} \qquad (29)$$

The procedure outlined above, though simple, suffers from two disadvantages that may be pertinent in some applications. The first is that model reduction methods using explicit moments suffer from numerical ill-conditioning, making them of limited value for q more than 10 or so. The second is that the form Equation (29) has time-varying poles. Using Floquet theory, it can be shown that the transfer function $H(t_1, s)$ has a potentially infinite number of poles that are independent of $t_1$ (these poles are simply the Floquet eigenvalues shifted by multiples of the system frequency), together with residues that do, in fact, vary with $t_1$. It is desirable to obtain a reduced-order model with similar properties. In fact, this requirement is equivalent to obtaining a reduced system in the time-domain form of Equation (3), which is very desirable for system-level modeling applications. Krylov-subspace procedures for TVP that eliminate both problems will now be explained.

TVP-K: TVP using Krylov-subspace Methods

In this section, the application of the block-Lanczos algorithm (see, for example, J. Aliaga, D. Boley, R. Freund, and V. Hernandez, *A Lanczos-Type Algorithm for Multiple Starting Vectors*, 1996, Numerical Analysis Manuscript No. 96–18, Bell Laboratories R. Freund, G. H. Golub, and N. M. Nachtigal, *Iterative Solzitioii of Linear Systems*, Acta Numerica, pages 57–100, 1991, both of which being incorporated herein by reference) to any multi-output matrix form of the LTV transfer function will be described. Alternatively, operator-Lanczos or any Arnoldi-based method can also be applied. Using Krylov-subspace methods provides not only a numerically stable way to obtain a reduced-order model, but, in addition, the resulting reduced transfer function has a form similar to that of $H(t_1, s)$ in Equation (7), with similar properties like a possibly infinite number of $t_1$-invariant poles.

Both Equations (19) and (26) are in the form:

$$\vec{H}(s) = D^T [sC + \mathcal{J}]^{-1} \vec{B} \qquad (30)$$

Equation (30) can be used directly for reduced-order modeling by block-Lanczos methods. Running the block-Lanczos algorithm in q steps using the quantities D, C, J and $\vec{B}$ produces the following matrices and vectors: $L_q$ (of size q×N), $R_q$ (size q×1) and $T_q$ (size q×q). The $q^{th}$-order approximant $\vec{H}^q(s)$ is defined by:

$$\vec{H}^q(s) = L_q^T [I_{q \times q} - sT_q]^{-1} R_q \qquad (31)$$

Then $\vec{H}^q(s) \sim \vec{H}(s)$, in the sense that a certain number of matrix-moments of the two quantities are identical. Further it is typically the case in practice that even small values of q lead to excellent approximations.

Using the quantities in Equation (31), an equivalent system of size q can be obtained. The procedure for the frequency-domain matrix form described above is illustrated; the time-domain form is similar, differing simply in the choice of basis functions below. Define:

$$\vec{L}_q(t_1) = \sum_{i=-\infty}^{\infty} l_{q,i} e^{ji\omega_0 t_1} \qquad (32)$$

Where $L_{q,i}$ is the $i^{th}$ column of $L_q$. The approximate LTV transfer function $\vec{H}^q(t_1, s)$ is given by:

$$\vec{H}^q(t_1, s) = \vec{L}_q(t_1)^T [I_{q \times q} - sT_q]^{-1} R_q \qquad (33)$$

Equation (33) is the time-varying transfer function of the following $q^{th}$-order reduced system of time-domain equations:

$$-T_q \frac{\partial \bar{x}}{\partial t} + \bar{x} = R_q u(t) \quad (34)$$

$$z(t) = \vec{L}_q(t)\bar{x}(t)$$

$$z(t) = \vec{L}_q(t)\bar{x}(t)$$

where $\bar{x}(t)$ is a vector of size q, much smaller than that of the original system Equation (3).

The TVP-K procedure above has a number of useful properties:

(1) Equation (34) represents a linear time-invariant system, with the time-variation appearing only in the output equation. This feature makes the reduced-order model very easy to incorporate in existing simulation tools.

(2) In practice, only the baseband-referred transfer functions corresponding to harmonics of interest can be represented in Equation (18), thereby reducing the number of columns of D. Similarly, any postprocessing for averaging/Fourier analysis can be directly incorporated in Equation (25), thereby reducing the number of time-domain outputs.

(3) Equation (33) can be shown to imply that $\vec{H}^q(t_1, s)$ has a possibly infinite number of time-invariant poles, similar to $\vec{H}^q(s)$. Further, the eigenvalues of $T_q$ are the Floquet exponents of the reduced-order model, which approximate those of the original LTV system. The poles and residues of the reduced-order models of $H_i(s)$ can be easily calculated from the eigenvalues of $T_q$. The Floquet exponents are also useful in oscillator phase noise applications.

(4) Krylov-subspace algorithms such as Lanczos and Arnoldi require only matrix-vector products with C and linear system solutions with J. Though both matrices can be large, dense or difficult to apply direct solution techniques to, exploiting structure and using iterative linear algebra techniques can make these computations scale almost linearly with problem size. When these fast techniques are employed, the computation required by the TVP algorithm grows approximately linearly in circuit size and number of harmonics to time-points, making it usable for large problems.

(5) The numerical ill-conditioning problem with explicit moment matching that was described above is eliminated using Krylov methods, hence TVP can be run up to large values of q if necessary.

(6) A system with $p_i$ inputs and $p_o$ outputs can be handled easily, by stacking the extra outputs into $\vec{H}$(resulting in D of size nN×$p_o$N), and incorporating the inputs into $\vec{B}$ (to form a rectangular matrix of size nN×$p_i$).

A Hand-calculable Example

Figure 4:
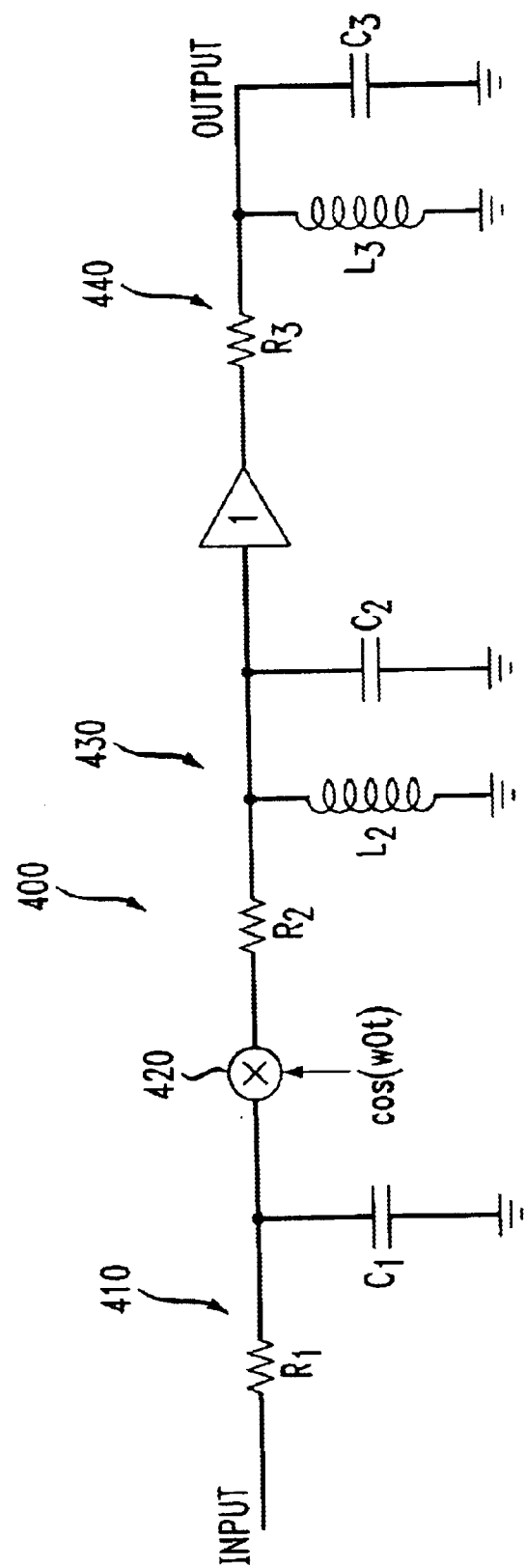
FIG. 4 illustrates an exemplary electronic circuit that the apparatus or the method of the present invention may analyze.

Turning now to FIG. 4, illustrated is an exemplary electronic circuit that the apparatus or the method of the present invention may analyze. The circuit, generally designated 400, is an upconverter, consisting of a low-pass filter 410, an ideal mixer 420 and two bandpass filter stages 430, 440. The component values were chosen to be: $R_1$–160Ω, R2=1.6Ω, R3=500Ω, $C_1=C_2=C_3$=10 nF, and $L_2=L_3$=25.35 nH. These values result in a low-pass filter 410 with a pole at 100 kHz, and band-pass filters 430, 440 with a center frequency of 10 MHz and bandwidths of about 10 kHz and 30 kHz respectively. The LO frequency for the mixer 420 was chosen to be 10 Mhz.

With reference to FIG. 3, the baseband-referred transfer functions of interest in this case are $H_1(s)$ and $H_{-1}(s)$, since they appear in the desired up- and down-conversion paths. It can be shown that $H_{-1}(s)=H^*_1(-s)$, hence it suffices to consider only $H_1(s)$ here. The expression for $H_1(s)$ can be derived easily using simple frequency-translation concepts; it is:

$$H_1(s) = \frac{0.5}{1+sC_1R_1} \frac{\frac{(s+j\omega_0)L_2}{1+(s+j\omega_0)^2 L_2 C_2}}{R_2 + \frac{(s+j\omega_0)L_2}{1+(s+j\omega_0)^2 L_2 C_2}} \frac{\frac{(s+j\omega_0)L_3}{1+(s+j\omega_0)^2 L_3 C_3}}{R_3 + \frac{(s+j\omega_0)L_3}{1+(s+j\omega_0)^2 L_3 C_3}} \quad (35)$$

Figure 5A:
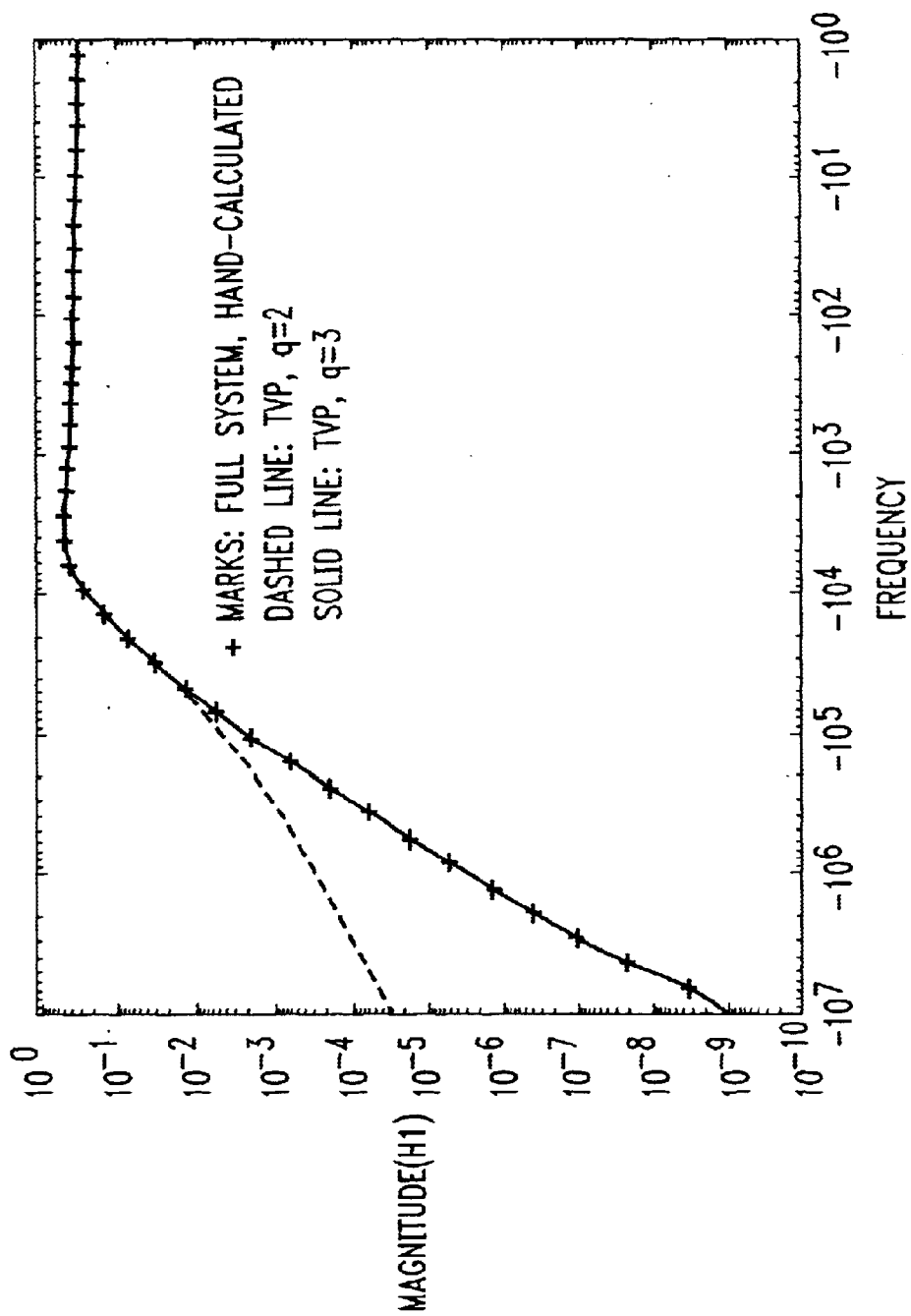
FIGS. 5A and 5B illustrate nonreduced transfer functions associated with the circuit of FIG. 4 and reduced-order models thereof.
Figure 5B:
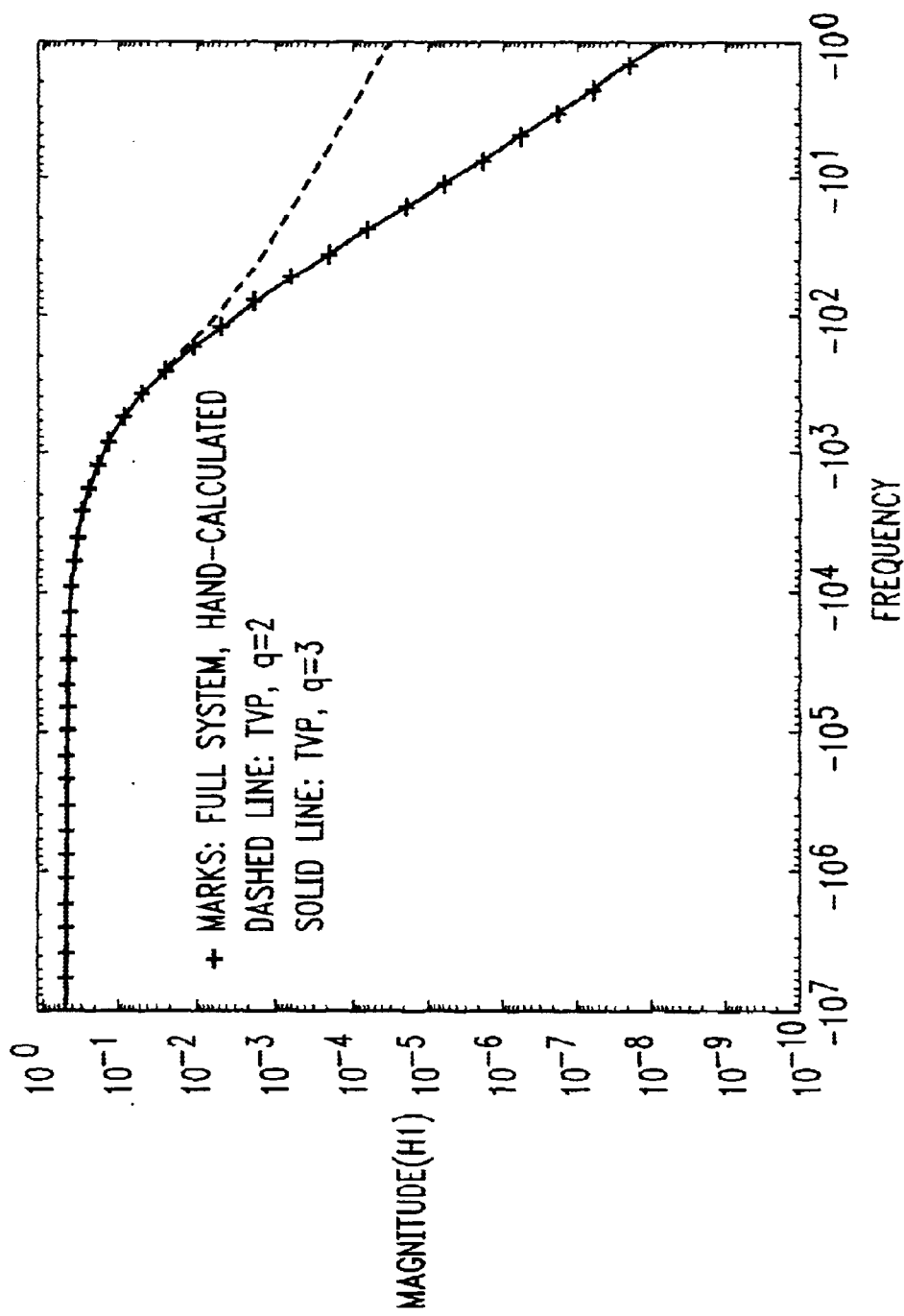

Equation (35) is plotted for positive and negative frequencies in FIGS. 5A and 5B, respectively. Also plotted in FIGS. 5A and 5B are the reduced-order models obtained from TVP with q=2 and q=3. It can be seen that for q=2, TVP produces a reasonable approximation, whereas for q=3, the match is substantially perfect, even though the original system is of order five.

The poles of the original system and those from TVP are shown in Table 1, below.

TABLE 1

Poles of $H_1(s)$, Original Transfer Function and Reduced-Order Models

| Original System | TVP, q = 2 | TVP, q = 3 |
|---|---|---|
| –1.99e-5 + j1.55e-5 | –1.98e-5 + j1.56e-5 | –1.99e-5 + j1.55e-5 |
| –9.43e-6 + j2.31e-6 | –9.73e-6 + j2.18e-6 | –9.43e-6 + j2.31e-6 |
| –1.6e-6 | | –1.6e-6 |
| –2.27e-11 + j7.95e-9 | | |
| –1.43e-11 + j7.96e-9 | | |

I-channel Buffer and Mixer Circuit

TVP can be employed to reduce a portion of a commercially-available W2013 RF integrated circuit (RFIC) consisting of an I-channel buffer and mixer. The circuit consisted of about n=360 nodes, and was excited by a local oscillator at 178 Mhz driving the mixer, while the RF input was fed into an I-channel buffer. The time-varying system was obtained around a steady state of the circuit at the oscillator frequency; a total of N=21 harmonics were considered for the time-variation.

Figure 6A:
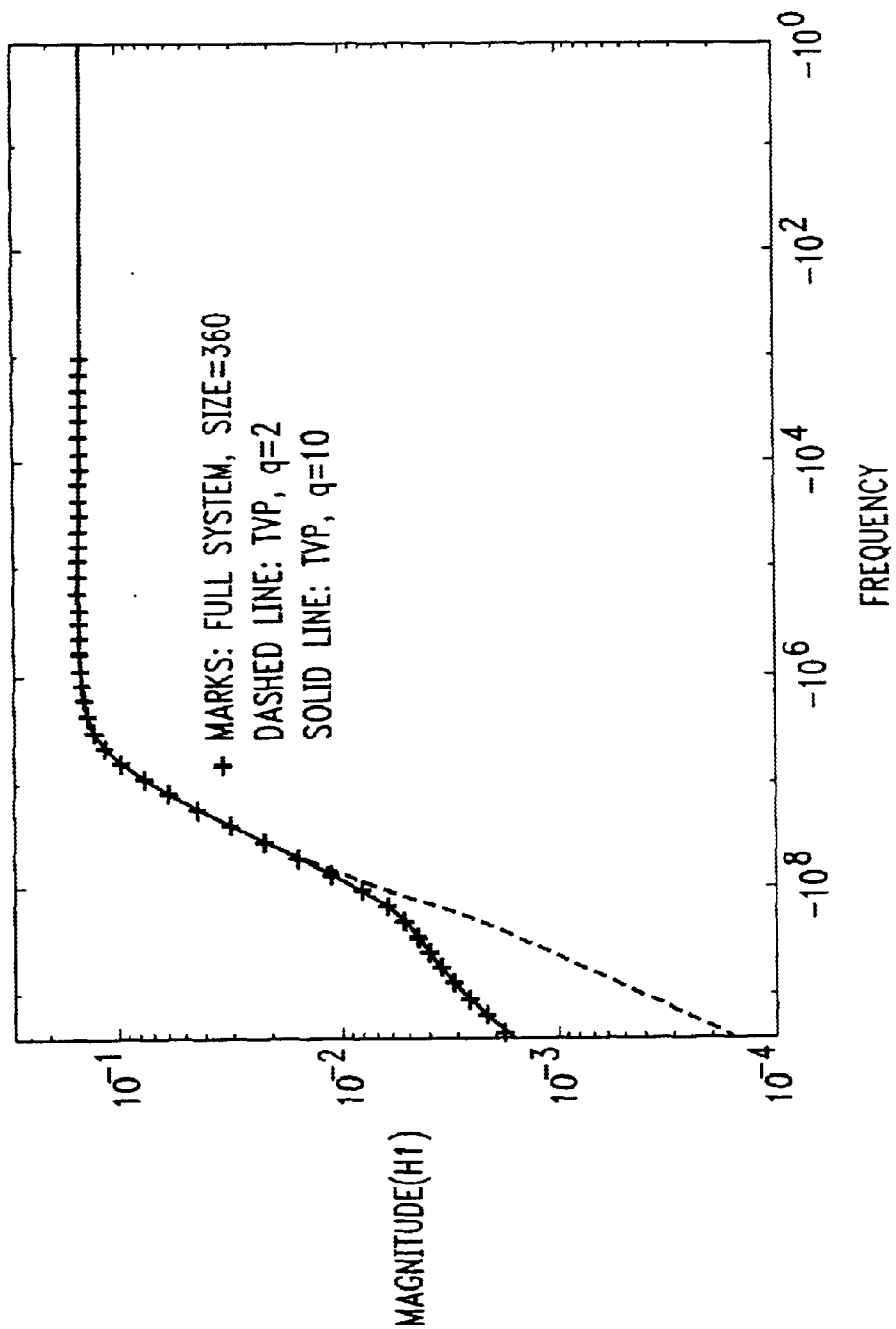
FIGS. 6A and 6B illustrate nonreduced transfer functions associated with a commercially-available, I-channel buffer and mixer and reduced-order models thereof
Figure 6B:
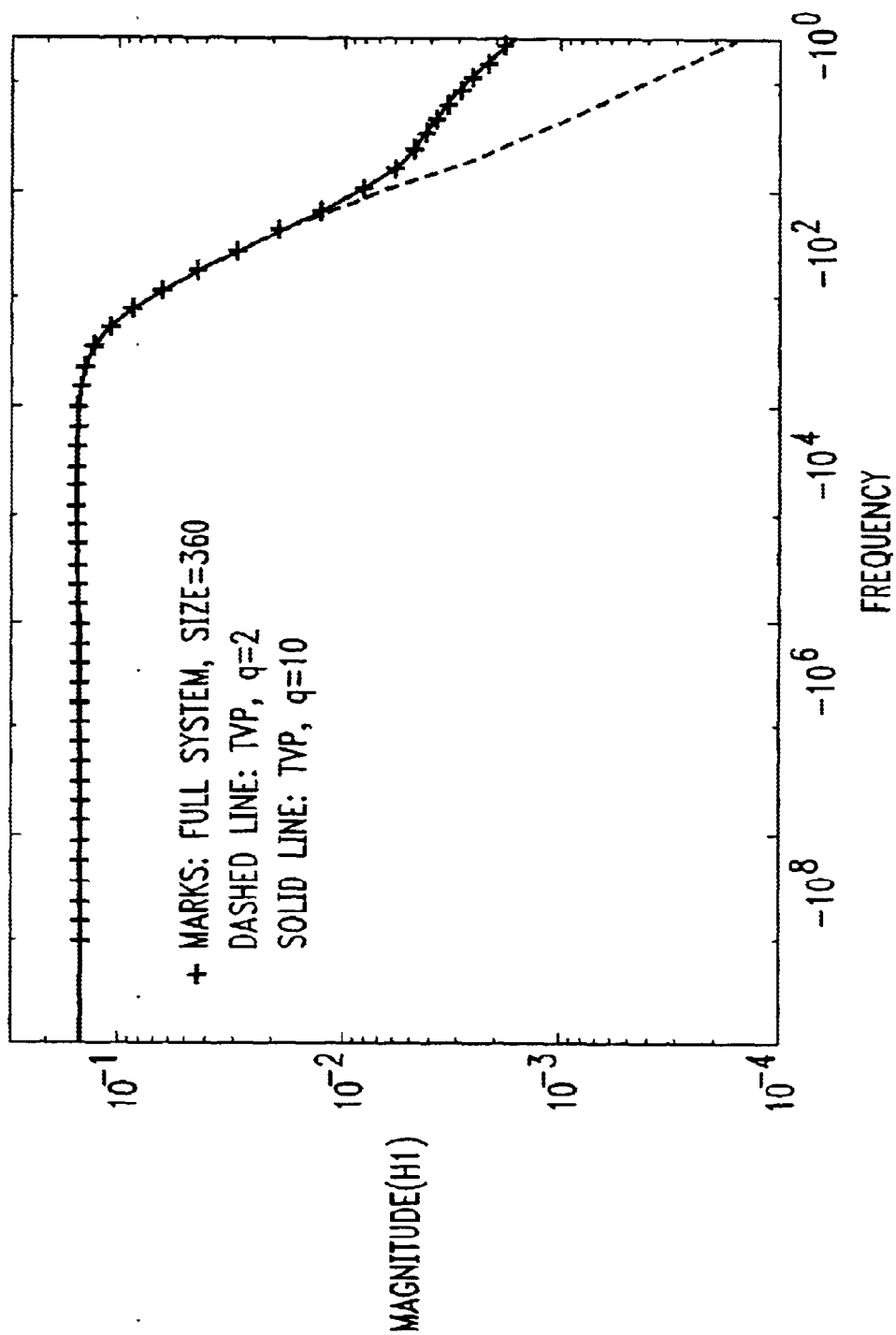

FIGS. 6A and 6B illustrate nonreduced transfer functions associated with the I-channel buffer and mixer and reduced-order models thereof. The points marked "+" were obtained by direct computation of Equation (17), while the lines were computed using the TVP-generated reduced-order models with q=2 and q=10, respectively. Even with q=2, a size reduction of two orders of magnitude, the reduced-order model provides a good match up to the LO frequency. When the order o approximation is increased to 10, the reduced-order model is substantially identical up to well beyond the LO frequency. Evaluating the reduced-order models was more than three orders of magnitude faster than evaluating the transfer function of the original system.

The poles of the reduced-order models for $H_1(s)$ are shown in Table 2, below.

TABLE 2

Reduced-Order Models of Poles of $H_1(s)$ for the I-channel Buffer and Mixer

| TVP, q = 2 | TVP, q = 3 |
| --- | --- |
| −2.95e-8 | −2.95e-8 |
| −2.30e-9 + j1.00e-11 | −1.69e-8 |
|  | −2.81e-9 + j4.56e-9 |
|  | −2.81e-9 + j4.56e-9 |
|  | −2.54e-10 + j6.85e-13 |
|  | −2.85e-11 + j5.84e-11 |
|  | −2.53e-11 + j5.54e-11 |
|  | −2.12e-9 + j4.03e-13 |
|  | −3.16e-9 + j1.15e-14 |
|  | −3.06e-9 + j4.63e-11 |

From the above, it is apparent that the present invention provides an apparatus for, and method of, modeling a time-varying system and a computer-readable storage medium containing the apparatus or the method. In one embodiment, the apparatus includes: (1) a transfer function generator that develops, for the system, a linear, time-varying transfer function of a particular order and having separate scales corresponding to time variations in the system and an input thereto and (2) an approximator, coupled to the transfer function generator, that approximates the transfer function to yield a model of an order lower than the particular order.

Although one or more embodiments of the present invention have been described in detail, those skilled in the pertinent art should understand that they can make various changes, substitutions and alterations thereto without departing from the spirit and scope of the invention in its broadest form or the claims.

What is claimed is:

1. An apparatus for modeling a time-varying system, comprising:
a transfer function generator that generates, for said system, a reducible, linear time-varying transfer function based on $t_1$ and s where a characteristic model is constructed based on $$\hat{Z}(t_1, s) = H(t_1, s)U(s)$$

having separate scales corresponding to time variations in said system and an input signal; and
an approximator, coupled to said transfer function generator, that approximates said transfer function to yield a model having a lower order than an order of said transfer function.

2. The apparatus as recited in claim 1 wherein said approximator is a Padé approximator, said model containing a Padé approximation of said transfer function.

3. The apparatus as recited in claim 1 wherein said lower order of said model is selectable.

4. The apparatus as recited in claim 1 wherein said approximator explicitly calculates moments of said transfer function and matches said moments to yield said model.

5. The apparatus as recited in claim 1 wherein said approximator replaces said transfer function directly with said model, moments of said transfer function being matched implicitly.

6. The apparatus as recited in claim 5 wherein said approximator replaces said transfer function by employing a Krylov-subspace process.

7. The apparatus as recited in claim 1 wherein said transfer function contains a nonlinearity.

8. A method of modeling a time-varying system, comprising:
generating, for said system, a reducible, linear time-varying transfer function based on $t_1$ and s where a characteristic model is constructed based on $$\hat{Z}(t_1, s) = H(t_1, s)U(s)$$

having separate scales corresponding to time variations in said system and an input signal; and
approximating said transfer function to yield a model having a lower order than an order of said transfer function.

9. The method as recited in claim 8 wherein said approximating comprises Padé approximating said transfer function.

10. The method as recited in claim 8 wherein said lower order of said model is selectable.

11. The method as recited in claim 8 wherein said approximating comprises:
explicitly calculating moments of said transfer function; and
matching said moments to yield said model.

12. The method as recited in claim 8 wherein said approximating comprises replacing said transfer function directly with said model, moments of said transfer function being matched implicitly.

13. The method as recited in claim 12 wherein said approximating comprises replacing said transfer function by employing a Krylov-subspace process.

14. The method as recited in claim 8 wherein said transfer function contains a nonlinearity.

15. A computer-readable storage medium having instructions thereon that cause a computer to:
generate, for said system, a reducible, linear time-varying transfer function based on $t_1$ and s where a characteristic model is constructed based on $$\hat{Z}(t_1, s)H(t_1, s)U(s)$$

having separate scales corresponding to time variations in said system and an input signal; and
approximate said transfer function to yield a model having a lower order than an order of said transfer function.

16. The storage medium as recited in claim 15 wherein said instructions cause said computer to Padé approximate said transfer function.

17. The storage medium as recited in claim 15 wherein said lower order of said model is selectable.

18. The storage medium as recited in claim 15 wherein said instructions cause said computer to:
calculate moments of said transfer function explicitly; and
match said moments to yield said model.

19. The storage medium as recited in claim 15 wherein said instructions cause said computer to replace said transfer function directly with said model, moments of said transfer function being matched implicitly.

20. The apparatus as recited in claim 19 wherein instructions cause said computer to replace said transfer function by employing a Krylov-subspace process.

21. The storage medium as recited in claim 15 wherein said transfer function contains a nonlinearity.

* * * * *